United States Patent

Theurer

[11] 4,015,070
[45] Mar. 29, 1977

[54] SIGNAL DISTRIBUTION ASSEMBLY AND METHOD FOR ASSEMBLING

[75] Inventor: Donald Leroy Theurer, Fort Wayne, Ind.

[73] Assignee: The Magnavox Company, Fort Wayne, Ind.

[22] Filed: June 23, 1975

[21] Appl. No.: 589,272

[52] U.S. Cl. .............................. 174/52 R; 174/51; 339/17 LC
[51] Int. Cl.² ........................................ H05K 5/04
[58] Field of Search ................ 174/52 R, 52 S, 51, 174/50; 339/17 R, 17 B, 17 L, 17 LC

[56] References Cited

UNITED STATES PATENTS

| | | | |
|---|---|---|---|
| 2,462,491 | 2/1949 | Hallett | 174/52 S X |
| 2,777,998 | 1/1957 | Shepherd | 174/52 R X |
| 2,880,293 | 3/1959 | Blanco | 174/52 R X |
| 3,429,980 | 2/1969 | Guttmann | 174/52 S |
| 3,440,329 | 4/1969 | Winston | 174/52 R |
| 3,500,131 | 3/1970 | Seeley et al. | 174/52 R X |
| 3,829,604 | 8/1974 | Tanaka | 174/52 S |
| 3,904,812 | 9/1975 | Daffron | 174/52 R |

*Primary Examiner*—J. V. Truhe
*Assistant Examiner*—D. A. Tone
*Attorney, Agent, or Firm*—Thomas Briody; William S. Streeter; George R. Pettit

[57] ABSTRACT

An electrical signal distribution assembly for splitting an input signal into several output signals, comprising a uniquely constructed housing with integral connector shells and internal projections that fixedly hold a printed circuit board in place without requiring any screws, bolts, soldering or crimping operation. The connector assemblies are arranged in a manner to allow rapid assembly. The opening through which the printed circuit board is inserted is closed in a manner not requiring additional hardware.

14 Claims, 4 Drawing Figures

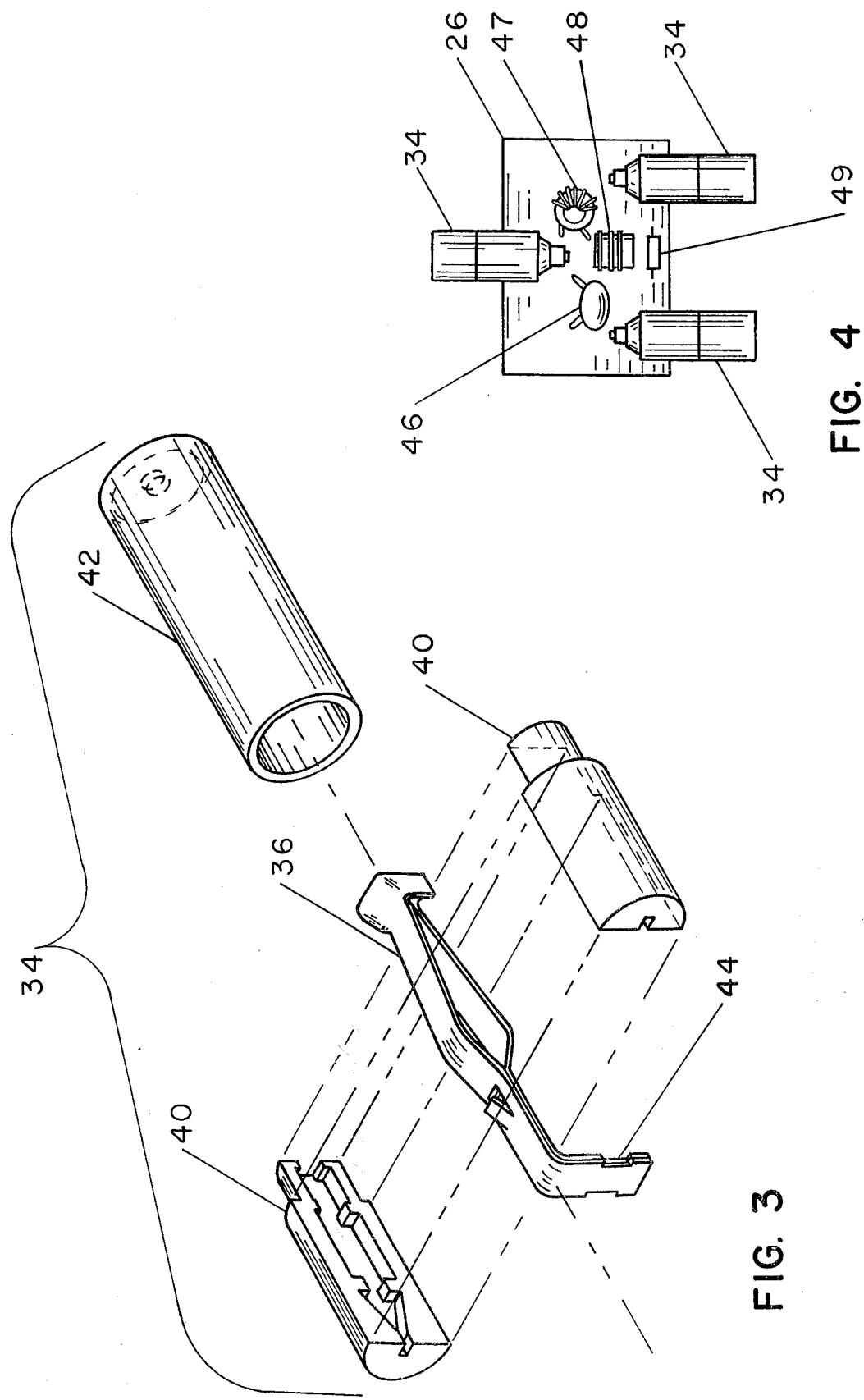

SIGNAL DISTRIBUTION ASSEMBLY AND METHOD FOR ASSEMBLING

BACKGROUND OF THE INVENTION

The present invention relates to a signal distribution assembly and a method of assembling the signal distribution assembly. More particularly, the present invention relates to a uniquely constructed enclosure for use in a CATV signal distribution cable network.

In CATV signal distribution systems, signal distribution assemblies are used to divide appreciated signal from a main cable into several signals for distribution to subscriber cables. Many signal distribution assemblies are required in a large distribution system, and it will therefore be appreciated that it would be desirable to produce these items in a manner that would result in saving material cost and manufacturing time.

In the past, signal distribution assembly enclosures have been made by forming a housing from thin sheet metal and punching holes to accept connectors which were held in place by nuts and washers. Electrical components were then soldered or attached in some manner to the inside portion of the connectors prior to completely enclosing the housing. These enclosures required a considerable amount of manufacturing labor to assemble and accordingly were not economical to produce.

More recently, signal distribution assembly enclosures have been constructed that have connector shells made as an intergral part of the housing, which overcome some of the labor consuming time of assembling connectors to the housing. Also the electrical components were assembled on a printed circuit board and then inserted in the housing. Although this construction reduced some of the labor, the step of securing the printed circuit board and the cost of the additional material used was not eliminated. In addition, there was a problem of providing strain relief for the cables connected to the signal distribution assembly.

In view of the foregoing, it should now be understood that it would be desirable to provide an improved signal distribution assembly that would solve the above and other problems.

Accordingly, one of the objects of the present invention is to provide a signal distribution assembly that is time saving to assemble and does not require miscellaneous hardware or material to assemble.

Another object of the invention is to provide a signal distribution housing that will fixedly hold a printed circuit board without the benefit of soldering or mounting hardware.

Yet another object of the invention is to provide an improved signal distribution housing that has interface connectors that are an integral part of the housing and a cover closing one side of the housing that is held fixedly in place without screws or soldering.

A further object is to provide a method of assembling an improved signal distribution assembly without using miscellaneous hardware and material and which reduces the assembling time.

SUMMARY OF THE INVENTION

In carrying out the above and other objects of the invention in one form, I provide an improved signal distribution assembly that reduces the amount of time, labor, and miscellaneous material required in putting the assembly together. More specifically a housing is provided having a plurality of cable connectors formed as an integral part thereof. The housing has means for receiving a printed circuit board and fixedly holding it in place without the need of attaching hardware or other material such as solder or epoxy.

A cover is used to close the opening through which the printed circuit board is inserted into the housing. The cover is held in place by deforming a portion of the housing adjacent to the cover thereby eliminating the need for any extra attaching hardware or material.

I also provide a method of assembling a signal distribution assembly by inserting a printed circuit board within a housing having means to receive and hold the printed circuit board in a predetermined position thereby eliminating any attaching materials and closing the portion of the housing through which the printed circuit board was inserted.

The subject matter which I regard as my invention is set forth in the appended claims. The invention itself, however, together with further objects and advantages thereof, may be better understood by referring to the following detailed description taken in conjunction with the accmpanying drawings.

BRIEF DESCRIPTION OF THE DRAWINGS

FIG. 3 is an exploded view of the internal part of a connector assembly that is used in the signal distribution assembly; and FIG. 4 is a plan view of the printed circuit board that fits in the signal distribution housing.

The exemplifications set out herein illustrate the preferred embodiment of the invention in one form thereof, and such exemplification is not to be construed as limiting in any manner.

DESCRIPTION OF THE PREFERRED EMBODIMENTS

Figure 1:
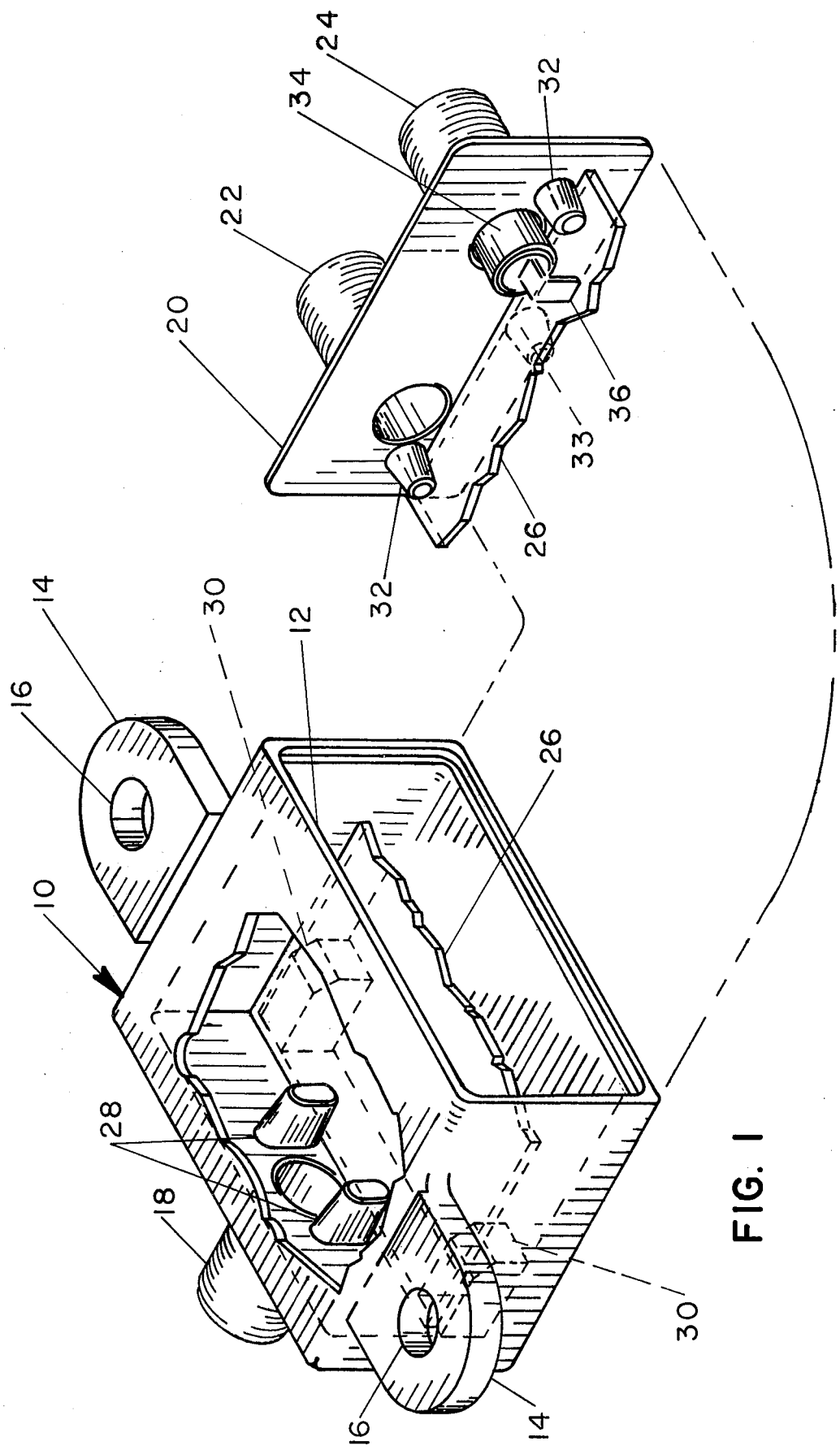
FIG. 1 is a perspective view of a signal distribution assembly partly exploded and with parts removed and parts broken away and that embodies the invention in one form.

Referring now to FIG. 1, there is shown a signal distribution housing 10 with one side open and a cut-away to permit better illustration of the interior. Housing 10 has an opening 12 to permit access to the inside of housing 10. Two mounting ears 14 each having a hole 16 provide a means of mounting housing 10 to any suitable object. Although mounting ears 14 are provided with holes 16, it will be understood that instead of holes 16 the ears 14 could be provided with slots. It will also be recognized by those skilled in the art that a wedge-clamp arrangement for attaching housing 10 to a cable could be used thereby eliminating the mounting ears altogether.

Housing 10 has connector or connector shell 18 formed as an integral part thereof. Cover or lid 20 is a means for closing opening 12 and has two connector shells 22, 24 formed as an integral part of cover 20. Connector shells 18, 22, 24 are preferably threaded for mating with connecting cables. It will be appreciated that by forming connector shells 18, 22, 24 integrally with housing 10 and cover 20 that labor is saved over the prior art methods of using nuts and washers or soldering to attach the connectors to the housing. Although single connector 18 is shown as made with housing 10 while connectors 22, 24 are formed with cover 20, the arrangement could be otherwise. That is, the housing could be formed with a plurality of connectors while the cover could be formed with only one. In addition, the total number of connectors does not have to be limited to three as illustrated but could be any number desired for a given application.

Housing 10 and cover 20 can be cast or molded out of aluminum, however, it may be preferable to use zinc instead of aluminum since zinc is more malleable than aluminum and portions of housing 10 must be deformed around opening 12 in order to hold cover 20 in place.

One of the connectors is used to bring a signal into housing 10 where it is split or divided into several signals and fed out on the other connectors to, for instance, cables going to subscribers of a community antenna television (CATV) service or to individual television receivers of a particular subscriber.

Printed circuit board 26 has electrical components (not shown) mounted on it to split a signal with minimum loss to the signal and to provide isolation from one output cable to the other. The eletrical components are not shown on printed circuit board 26 in FIG. 1 so that the features of housing 10 could more clearly be shown. Printed circuit board 10 is fixedly held in place by projections 28 and 30 of housing 10. The projections are tapered for ease of starting printed circuit board 26 between projections 28, 30. The opposite end of printed circuit board 26 is shown broken away for ease of illustrating projections 32 and 33 holding the printed circuit board in place when housing 10 is closed by cover 20. Projections 32 are on one side of board 26 while projection 33 is on the other side. All the projections are tapered for ease of starting the printed circuit board between them. Although projections 28, 30, 32, and 33 are shown of different shapes, it will be understood that they could all be of the same shape or configuration. However, in preferred form, the projections are tapered to facilitate inserting the printed circuit board.

Connector assembly 34 is shown attached to printed circuit board 26 by center conductor 36. Connector shells 18 and 22 also have a connector assembly 34 to mate with them, however, these other connector assemblies are not shown in FIG. 1 so that other features of the invention could better be illustrated. It will be understood that the connector assemblies are fixed in a predetermined position to printed circuit board 26 through center conductors 36. These connector assemblies, such as 34, will then mate with their corresponding connector shells 18, 22, 24 when the printed circuit board is installed in housing 10 and cover 20 is in place. It will now be apparent that no soldering or handling of attaching hardware is necessary in assembling this improved signal distribution unit, accordingly, labor is greatly reduced in manufacturing this unit and the cost of miscellaneous attaching hardware and materials is eliminated.

Figure 2:
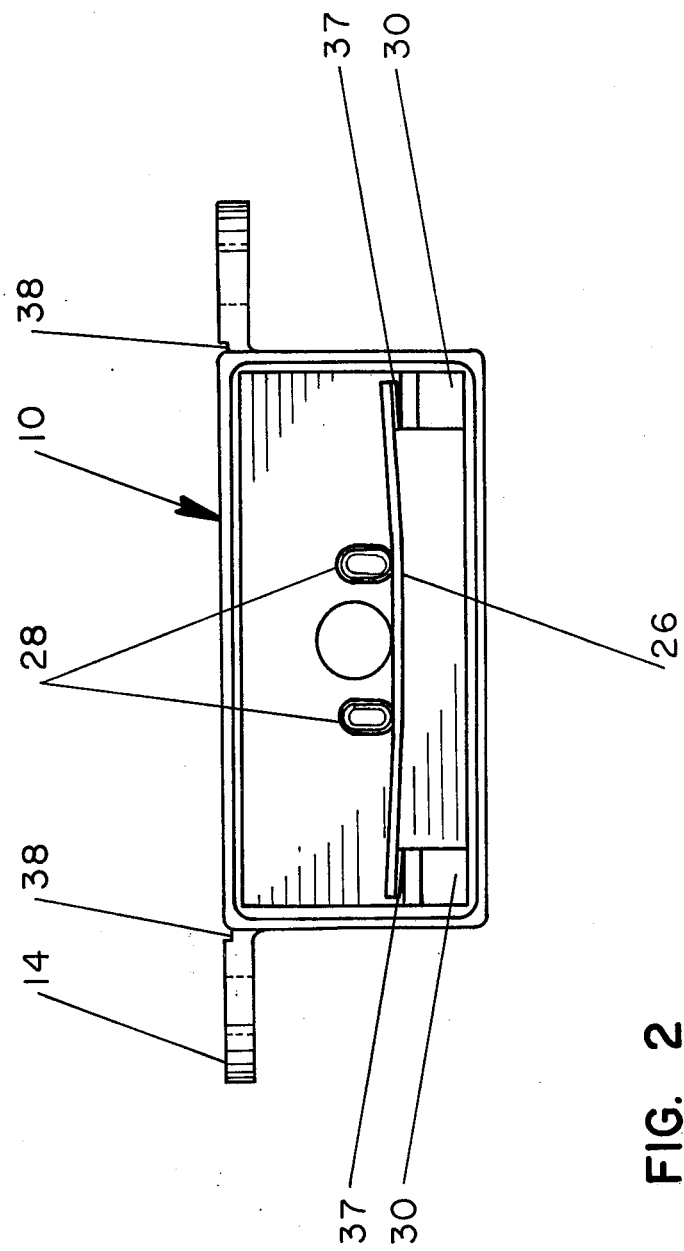
FIG. 2 is an end view looking into the open end of the signal distribution housing.

In FIG. 2 printed circuit board 26 is shown installed in housing 10 and fixedly held in place between projections 28 and 30. Board 26 is bowed slightly under projections 28. This bow causes greater pressure to be exerted by the edges of the board on projection 30. This pressure insures better contact between ground conductors 37 and projections 30. The ground conductors 37 provide an electrical return path for the electrical components (not shown) on printed circuit board 26. Ground conductors 37 also supplement the ground path between the shields of the cables that will be connected to housing 10. In the preferred embodiment, projections 32, 33 on cover 20 of FIG. 1 give a bow to board 26 in an opposite direction from the bow produced by projections 28, 30. The bow in the opposite direction is intended to prevent board 26 from developing a set which would contribute to reducing the pressure exerted on projections 30.

Indentations 38 are readily seen in FIG. 2. Indentations 38 are provided to allow mounting means or ears 14 to be easily broken off from housing 10. Should a failure occur in the signal splitter assembly after it is installed, the assembly can be removed by applying a force to housing 10 thereby causing mounting means 14 to break off at indentation 38. A new housing unit 10 can then be installed near the location of the failed unit. This signal splitter unit is so economical to assemble that it is intended to be a throw away item should a failure occur in one of them.

FIG. 3 is an exploded view of connector assembly 34. Insulator 40 is divided into two pieces, as shown, thereby facilitating enclosing a portion of center conductor 36. Center conductors 36 can be soldered to a circuit board and then insulators 40 can be placed around it, thereby avoiding having any heat from the soldering operation damaging the insulators. After insulators 40 are positioned around center conductor 36, this assembly is inserted into insulator 42 thereby holding insulators 40 in proper position. Center conductor 36 has attaching means 44 to facilitate attaching the center conductor to a printed circuit board. Center conductor 36 is bent at approximately a 90° angle so that connector assembly 34 will easily mate with the connector shells on housing 10 when the printed circuit board is inserted ito housing 10. Center conductor 36 receives the conductor of a mating cable and contact is made through a friction fit of the cable conductor in center conductor 36. This arrangement avoids any significant amount of strain being placed on the printed circuit board by the cable.

FIG. 4 shows circuit board 26 with electrical components 46, 47, 48, 49 mounted on the board. Three connector assemblies 34 are also shown mounted on the board and arranged in a configuration to mate with the connector shells of housing 10 in FIG. 1. Electrical components 46, 47, 48, 49 are representative of the components that may be used but not necessarily in the location shown. Also more or less or even different electrical components may be required.

The preferred method of assembling the improved signal splitter assembly is by inserting printed circuit board 26 into housing 10 so that it is held in position by projections 28, 30. Then closing the opening through which board 26 was inserted with closing means 20 which has projections that also hold board 26 and deforming a portion of housing 10 near closing means 20 so that the closing means is fixed in place.

The drawings do not show a gasket to better seal cover 20 in opening 12, however, it will be understood that one could be used when required. It is intended that housing 10 will be mounted with opening 12 in a downward position thereby preventing the entry _f falling moisture. Cover 20 mates with opening 12 making good contact around the periphery of the opening and in addition, the crimping or pinning of cover 20 to housing 10 will prevent interfering frequencies from entering the housing and causing interference problems. In the preferred embodiments housing 10 is die cast from an electrically conductive material. Although not shown, it will be understood that cover 20 can be held in the opening with an epoxy instead of deforming the housing.

It will now be appreciated that I have provided an improved signal distribution assembly that is easily assembled thereby reducing manufacturing labor and miscellaneous hardware and materials that were necessary with the prior art assemblies. Accordingly, it will be recognized by those skilled in the art that my improved signal distribution housing can be used as a signal splitter or as a tap.

Consequently, while in accordance with the Patent Statutes, I have described what at present are considered to be the preferred forms of my invention it will be obvious to those skilled in the art that numerous changes and modifications may be made herein without departing from the true spirit and scope of the invention, and it is therefore aimed in the following claims to cover all such modifications.

What I claim as new and desire to secure by Letters Patent of the United States is:

1. A CATV distribution assembly for splitting CATV signals supplied by a main cable into a plurality of CATV signals for output cables, comprising: an electrically conductive housing; a plurality of cable connectors formed as an integral portion of the housing; a plurality of projections located in predetermined positions on the interior of the housing; a circuit board fixedly held in the housing by the projections; and an electrical conductor fixed to the circuit board in a predetermined position so that the electrical conductor fits within a predetermined cable connector in position to mate with a cable when the cable is attached to the predetermined cable connector.

2. The assembly of claim 1 wherein the printed circuit board has contacts that mate with some of the plurality of projections thereby providing an electrical path between the printed circuit board and the housing.

3. The assembly of claim 1 wherein the electrical conductor is bent at an angle of substantially ninety degrees and is insulated by at least one piece of an insulating material.

4. An electrical signal distribution apparatus for distributing an input signal to a plurality of output cables, comprising: a housing; a plurality of connector shells being an integral part of the housing thereby eliminating any necessity of labor to assemble the connector shells to the housing; a printed circuit board; and means including plurality of projections located in predetermined positions within the housing so that the printed circuit board is held within the housing thereby eliminating any need for attaching or securing hardware.

5. The apparatus of claim 4 wherein the printed circuit board is held so that some of the projections are on one side of the printed circuit board and other of the projections are on another side of the printed circuit board.

6. The apparatus of claim 4 wherein one end of the housing is removable to permit access to the interior of the housing thereby permitting installation of the printed circuit board.

7. The apparatus of claim 4 wherein the printed circuit board has a number of center conductors of connector assemblies equal to the plurality of connector shells fixed thereto so that when the printed circuit board is within the housing each center conductor of the connector assemblies mates with a predetermined connector shell.

8. An electrical signal distribution apparatus comprising: a housing; means for mating with an external cable, the means for mating being an integral part of the housing thereby eliminating any assembly of the means for mating to the housing; a circuit board; and means holding the circuit board within the housing, the means for holding engages the circuit board thereby eliminating any need for hardware to attach the circuit board to the housing.

9. The apparatus of claim 8 wherein connector center conductors are mounted on the circuit board, the connector center conductors being bent at an angle of substantially ninety degrees to mate with the means for mating when the circuit board is inserted into the housing.

10. A method of assembling a signal distribution apparatus comprising the steps of: inserting a printed circuit board within a housing having means to receive and hold the printed circuit board in a predetermined position; flexing the printed circuit board so that the printed circuit board can be inserted between the means to receive and hold; holding the printed circuit board in a flexed configuration within the housing by the means to receive and hold thereby eliminating any attaching hardware; and closing the portion of the housing through which the printed circuit board was inserted.

11. The method of claim 10 further including deforming a portion of the housing adjacent to a means to close the portion of the housing through which the printed circuit board was inserted so that the deformed portion holds the means to close in fixed position.

12. A method of assembling a signal distribution assembly comprising the steps of: aligning at least one connector assembly that is mounted on a printed circuit board with at least one connector shell which is an integral portion of a housing; inserting the printed circuit board into the housing between means for holding the printed circuit board; holding the printed circuit board within the housing with the means for holding and closing the opening through which the printed circuit was inserted.

13. The method of assembling of claim 12 further including deforming the printed circuit board a predetermined amount so that the printed circuit board can be inserted into the housing between the means for holding.

14. An electrical signal distribution unit having at least one input connector and at least one output connector comprising: an electrically conductive housing having an opening and a plurality of projections within the housing; a circuit board held between the projections so that there is at least one projection on either side of the circuit board; a center conductor for each of the at least one input connector and the at least one output connector, the center conductor entering a respective connector when the circuit board is inserted between the projections; and a cover for the opening in the housing.

* * * * *